United States Patent
Connell

(10) Patent No.: US 11,073,581 B2
(45) Date of Patent: Jul. 27, 2021

(54) SYSTEM AND METHOD FOR INTEGRATED ACTIVE DETUNING IN MAGNETIC RESONANCE IMAGING

(71) Applicant: SYNAPTIVE MEDICAL INC., Toronto (CA)

(72) Inventor: Ian Robert Oliphant Connell, Toronto (CA)

(73) Assignee: Synaptive Medical Inc., Toronto (CA)

( * ) Notice: Subject to any disclaimer, the term of this patent is extended or adjusted under 35 U.S.C. 154(b) by 20 days.

(21) Appl. No.: 16/419,098

(22) Filed: May 22, 2019

(65) Prior Publication Data
US 2020/0371175 A1  Nov. 26, 2020

(51) Int. Cl.
 G01R 33/36  (2006.01)
 G01R 33/34  (2006.01)

(52) U.S. Cl.
 CPC ..... *G01R 33/3621* (2013.01); *G01R 33/34076* (2013.01); *G01R 33/3614* (2013.01)

(58) Field of Classification Search
 CPC .......... G01R 33/3621; G01R 33/34076; G01R 33/3614
 See application file for complete search history.

(56) References Cited

U.S. PATENT DOCUMENTS

| | | | |
|---|---|---|---|
| 4,684,895 A * | 8/1987 | Misic | G01R 33/3678 324/309 |
| 6,501,274 B1 | 12/2002 | Ledden | |
| 7,012,429 B1 * | 3/2006 | Ledden | G01R 33/3453 324/318 |
| 7,268,554 B2 * | 9/2007 | Vaughan | G01R 33/34046 324/318 |
| 7,538,554 B2 | 5/2009 | Wendt et al. | |
| 2002/0156362 A1 | 10/2002 | Bock et al. | |
| 2004/0124838 A1 | 7/2004 | Duerk et al. | |
| 2010/0277175 A1 | 11/2010 | Weiss | |
| 2015/0323622 A1 | 11/2015 | Wang | |
| 2016/0209481 A1 * | 7/2016 | Gunamony | G01R 33/3415 |
| 2018/0074140 A1 | 3/2018 | Yang et al. | |

FOREIGN PATENT DOCUMENTS

FR  2837929  10/2003

OTHER PUBLICATIONS

Examination Report issued by the Intellectual Property Office of the UK in relation to GB Application No. GB2007736.8 dated Sep. 22, 2020, 1 pg.

* cited by examiner

*Primary Examiner* — Jay Patidar
(74) *Attorney, Agent, or Firm* — Fish & Richardson P.C.

(57) ABSTRACT

A coil assembly includes: a radio frequency (RF) coil operable to be placed over a portion of a subject; a quarter-wave transformer coupled to the RF coil and configured to transform a characteristic impedance of the RF coil; and a diode placed behind the quarter-wave transformer and away from the RF coil, wherein the diode is operable to: (i) when the diode is forward biased, the diode turns the quarter-wave transformer into an open circuit such that the power amplifier drives the RF coil with sufficient electrical power for the RF coil to transmit an RF pulse into the portion of the subject; and (ii) when the diode is provided zero or reverse bias, the diode turns the quarter-wave transformer into a short circuit such that the RF coil is detuned from a Lamor frequency of nuclei of interest immersed in the main magnet.

20 Claims, 4 Drawing Sheets

SYSTEM AND METHOD FOR INTEGRATED ACTIVE DETUNING IN MAGNETIC RESONANCE IMAGING

BACKGROUND

The present disclosure relates to magnetic resonance imaging.

SUMMARY

In one aspect, some implementations provide a coil assembly for performing magnetic resonance (MR) imaging of a subject immersed in a main magnet. The coil assembly including: a radio frequency (RF) coil operable to be placed over at least a portion of the subject immersed in the main magnet; a quarter-wave transformer coupled to the RF coil and operable to transform a characteristic impedance of the RF coil to match an impedance of a power amplifier that drives the RF coil; and a diode placed behind the quarter-wave transformer and away from the RF coil, wherein the diode is operable to: (i) when the diode is forward biased, the diode turns the quarter-wave transformer into an open circuit such that the power amplifier drives the RF coil with sufficient electrical power for the RF coil to transmit an RF pulse into the portion of the subject; and (ii) when the diode is provided zero or reverse bias, the diode turns the quarter-wave transformer into a short circuit such that the RF coil is detuned from a Lamor frequency of nuclei of interest immersed in the main magnet.

Implementations may include one or more of the following features. The diode may be a positive-intrinsic-negative (PIN) diode. The RF coil may be a birdcage coil. The RF coil may be a quadrature coil. The RF coil may be without a diode. The RF coil may be integrated into a transmit/receive coil for transmitting the RF pulse into the portion of the subject and for receiving resonant RF signals emitted from the portion of the subject in response to the RF pulse being transmitted. When the diode is forward biased, the RF coil may be resonant. When the diode is provided zero or reverse bias, the short circuit may parallel a matching feed to the RF coil. The diode may be capable of switching between an "On" state and an "Off" state at a speed suitable for performing MR imaging. The diode may be capable of handling up to 4 kV peak voltage and 100 Watts of continuous RF power.

In another aspect, some implementations provide a magnetic resonance imaging (MRI) system that includes: a housing having a bore in which a subject to be imaged is placed; a main magnet accommodated by said housing and configured to generate a polarizing magnetic field within the bore; a coil assembly configured to generate and apply radio frequency (RF) pulses in sequence to scan the subject placed in the bore, the coil assembly including: a radio frequency (RF) coil operable to be placed over at least a portion of the subject immersed in the magnetic field; a quarter-wave transformer coupled to the RF coil and operable to transform a characteristic impedance of the RF coil to match an impedance of a power amplifier that drives the RF coil; and a diode placed behind the quarter-wave transformer and away from the RF coil, wherein the diode is operable to: when the diode is forward biased, the diode turns the quarter-wave transformer into an open circuit such that the power amplifier drives the RF coil with sufficient electrical power for the RF coil to transmit the RF pulses into the portion of the subject; and when the diode is provided zero or reverse bias, the diode turns the quarter-wave transformer into a short circuit such that the RF coil is detuned from a Lamor frequency of nuclei of interest immersed in the main magnet; gradient coils configured to provide perturbations to the polarizing magnet field that encode MRI signals acquired in response to the applied RF pulses; and a control unit coupled to the main magnet, the coil assembly and the gradient coils, the control unit configured to synchronize the coil assembly and the gradient coils such that the MRI signals are acquired and then reconstructed to form an image of at least the portion of the subject.

Implementations may include one or more of the following features.

The diode may be a positive-intrinsic-negative (PIN) diode. The RF coil may be a birdcage coil. The RF coil may be a quadrature coil. The RF coil may be without a diode. The RF coil may be integrated into a transmit/receive coil for transmitting the RF pulse into the portion of the subject and for receiving resonant RF signals emitted from the portion of the subject in response to the RF pulse being transmitted. When the diode is forward biased, the RF coil may be resonant. When the diode is provided zero or reverse bias, the short circuit may parallel a matching feed to the RF coil. The diode may be capable of switching between an "On" state and an "Off" state at a speed suitable for performing MR imaging. The diode may be capable of handling up to 4 kV peak voltage and 100 Watts of continuous RF power.

In yet another aspect, some implementations provide a method for operating a coil assembly on a magnetic resonance imaging (MRI) system. The method includes: placing a subject in a main magnet of the MRI system such that a radio frequency (RF) coil is located over at least a portion of the subject; driving the RF coil coupled to a quarter-wave transformer and a diode such that (i) when the diode is forward biased, the diode turns the quarter-wave transformer into an open circuit such that the power amplifier drives the RF coil with sufficient electrical power for the RF coil to transmit an RF pulse into the portion of the subject; and (ii) when the diode is provided zero or reverse bias, the diode turns the quarter-wave transformer into a short circuit such that the RF coil is detuned from a Lamor frequency of nuclei of interest immersed in the main magnet, and wherein the diode is placed behind the quarter-wave transformer and away from the RF coil.

The details of one or more aspects of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference symbols in the various drawings indicate like elements.

DETAILED DESCRIPTION

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

Magnetic resonance (MR) imaging employs at least one radio frequency (RF) coil to either excite the sample, receive signals from the sample, or perform a combination of both functions during a magnetic resonance imaging (MRI) acquisition. The resonant frequency of the RF coil is tuned to the Larmor frequency for the nuclei of interest which is determined by the field strength of the MRI imaging apparatus. The input impedance of the tuned RF coil is then transformed at the coil input to match the amplifier characteristic impedance (typically 50 Ohm's). When operating the tuned RF coil to perform MRI imaging of a patient, the RF coil can be electromagnetically switched "off" and "on" during transmission of RF pulses and reception of RF resonant signals. This switching is often achieved by shifting the resonant frequency of the RF coil sufficiently away from the Larmor frequency of interest. This mechanism is often known as "detuning". The switching can use positive-intrinsic-negative (PIN) diodes placed on an RF coil. In such configurations, when forward biased, the PIN diodes present short-circuits at their terminals that, along with appropriate PCB trace inductance and judicious placement of capacitors, resonate the RF coil at the Larmor frequency of interest. Due to the amount of direct current (DC) and RF current flowing through the PIN diodes during the transmit operation, significant amount of heat is generated such that heat dissipation becomes a concern. Additionally, the placement of PIN diodes distorts of homogeneity of the transmit field and reduces the overall efficiency of the RF coil.

Embodiments according to the present disclosure operates an RF coil without the above drawbacks by placing the diodes away from the resonating RF coil. The embodiments are not limited to PIN diodes for their fast switching times (desired for MRI pulse sequences), long install life, and high-power handling. In these embodiments, detuning is achieved to effectively isolate multiple RF coils from one another, thereby enabling the operation of multiple RF coils located inside the MRI scanner.

Figure 1A:
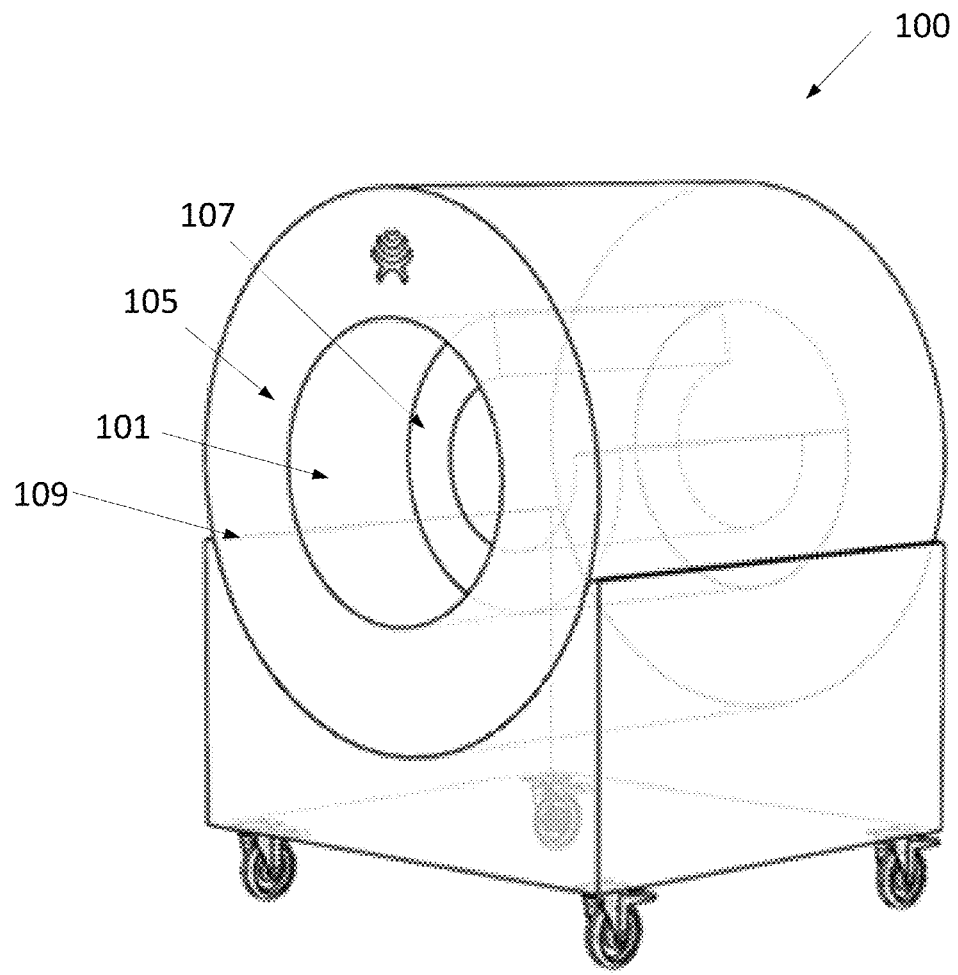
FIGS. 1A to 1B illustrate an example of an apparatus for performing magnetic resonance imaging (MRI).
Figure 1B:
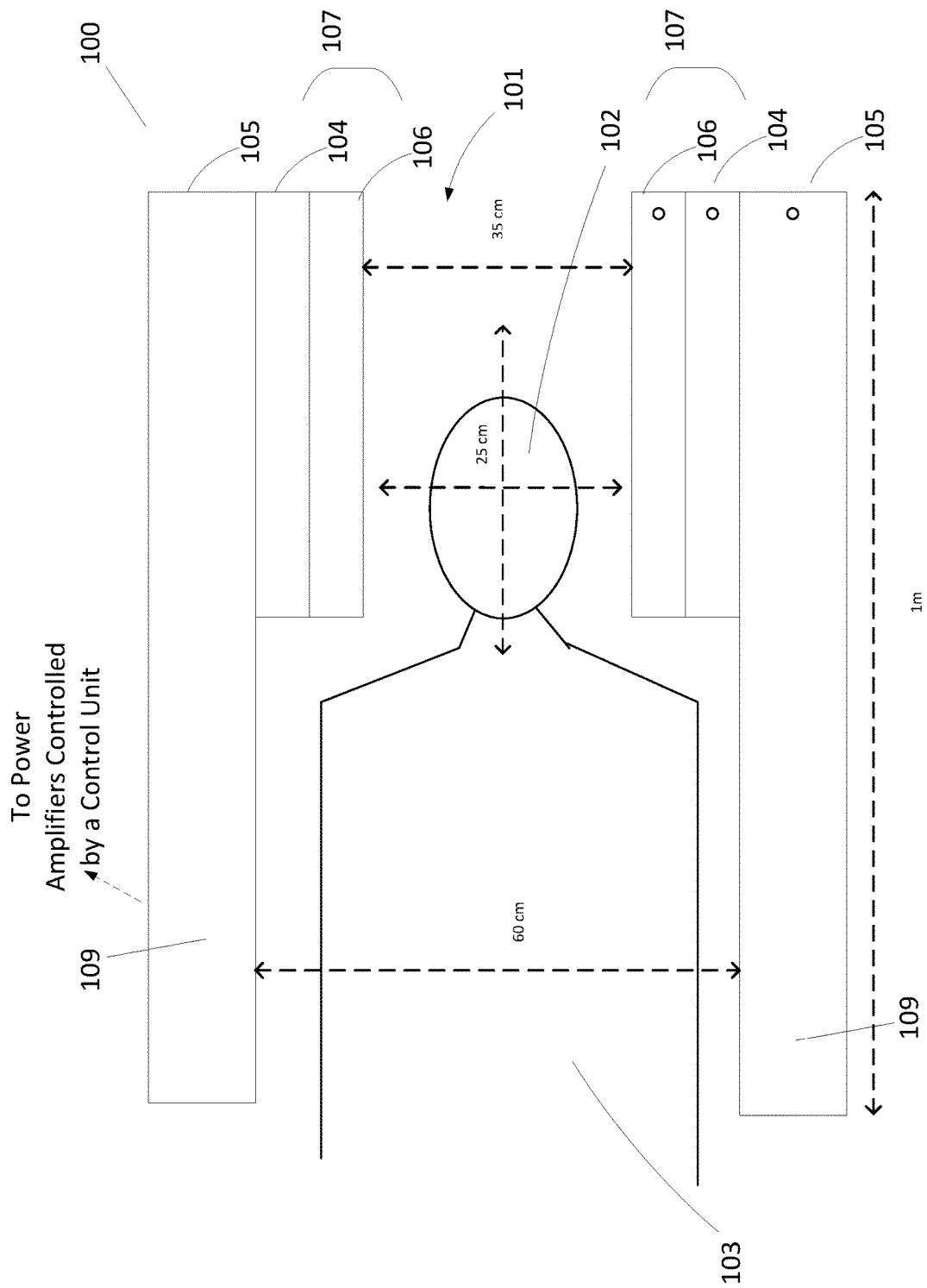

FIGS. 1A-1B show a perspective view and a cross-sectional view of an example of a magnetic resonance imaging (MRI) system 100 in which a solenoid magnet 105 is provided in a cylindrical shape with an inner bore 101. Coil assembly 107, including transmit coil 106 and gradient coil 104, is provided within solenoid magnet 105. Coil assembly 107 may generally be shaped as an annular structure and housed within the inner bore of solenoid magnet 105. In some implementations, annular coil assembly 107 only includes gradient coil 104. Gradient coil 104 generally provides field gradients in more than one directions, such as, for example, all three orthogonal spatial directions. Thus, gradient coil 104 may refer to three sets of coils, each configured to generate field fluctuations in a respective direction for the main field in the inner bore of the solenoid magnet 105. Such field fluctuations may cause magnetizations from various spatial locations to experience precessions at different frequencies, enabling encoding of spatial information of the magnetizations through RF excitation pulses.

In these implementations, annular coil assembly does not include transmit coil 106 or any receiver coil. For these implementations, radio-frequency (RF) excitation pulses are, for example, transmitted by local coils for imaging the head region 102 of patient 103. In one instance, a head coil in a birdcage configuration is used for both transmitting RF excitation pulses and receiving MR signals for imaging the subject. In another instance, a surface coil is used for transmitting an RF excitation pulse into the subject and a phased array coil configuration is used for receiving MR signals in response.

In some implementations, shimming coils 109 are housed within the cylindrical walls of solenoid magnet 105. Shimming coils 109 are powered by a group of power amplifiers. In some cases, the power amplifiers are housed in a control room and are connected to shimming coils 109 to provide shimming of the magnetic field within inner bore 101. In driving shimming coils 109, power amplifiers may be controlled by a control unit that generally includes one or more processors as well as programming logic to configure the power amplifiers. In some instances, the control unit is housed in a control room separate from the solenoid magnet 105 of the MRI system 100. Further, shimming coils 109 may not require active cooling using circulating coolant. In these implementations, an array of shimming coils can be used to provide adjustment to the field strength within the inner bore 101 such that the magnet field within the inner bore 101 becomes more homogenous.

The embodiments provided in this present disclosure enables the operation of multiple RF coils inside an MR magnet. As described earlier in this specification, an RF coil is a resonant structure used to either to either excite the sample, receive signals from the sample, or perform a combination of both functions during a magnetic resonance imaging (MRI) acquisition. When operating an RF coil in the presence of additional RF circuitry, for example, a close-fitting "receive-only coil," the RF coil can be switched "off" and "on" for two reasons. During transmission, a resonating structure located between the transmit coil and the sample results in a distortion of the transmit field and a reduction in efficiency. Additionally, transmit coils operate at power levels that far exceeds the range of receive-only circuits. For illustration, if such transmit coils are coupled to the receive-only coils, the power level during transmit events can destroy the low-power receive-only circuitry. During reception, the presence of any additional resonating structures in the vicinity of the receive-only RF coil results in signal degradation and an increase in overall system noise.

In this context, transmit coil 106, as an example of a radio frequency (RF) coil, can be switched "on" and "off," during transmit and receive operations. RF coils can be configured in an array for performing excitation, receiving signals or a combination of both functions. Arrays designed for signal excitation are known as "transmit coils." Arrays designed for signal reception are known as "receive coils." Arrays designed for both functions are known as "transceive coils." Generally, RF arrays are composed of multiple resonating antennae that are disposed in a judicious manner about the imaging region such that: (i) efficiency can be maximized during transmission, ii) the magnitude of the received signal can be maximized during reception (signal-to-noise ratio or 'SNR'), and (iii) a combination of both.

Figure 2:
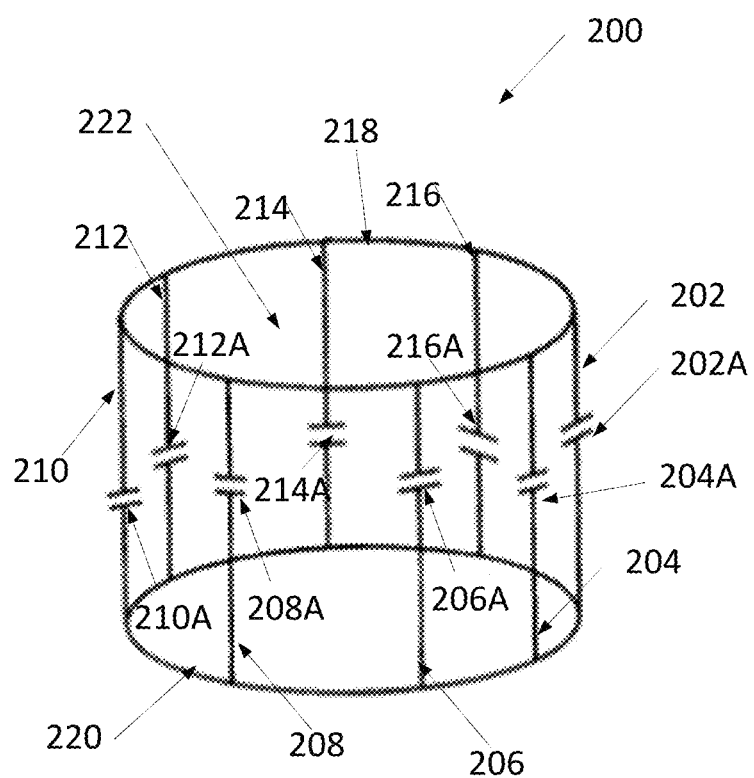
FIG. 2 illustrates an example of a birdcage coil capable of being incorporated into the apparatus for MRI as illustrated in FIG. 1.

Referring to the example of the birdcage coil 200 illustrated in FIG. 2, legs 202, 204, 206, 208, 210, 212, 214, and 216 vertically connects an upper circle 218 and a lower circle 220, thereby encompassing a cylindrical volume 222. In this illustration, legs 202, 204, 206, 208, 210, and 212 respectively includes capacitors 202A, 204A, 206A, 208A, 210A, and 212A. In some cases, by choosing the appropriate capacitances, the birdcage coil 200 operates as a volume resonator with respect to the volume within the birdcage coil 200. The birdcage coil 200 can be placed inside a main magnet (such as solenoid magnet 105) so that the cylindrical volume encloses a portion of a subject (such as head region 102 of patient 103).

Figure 3:
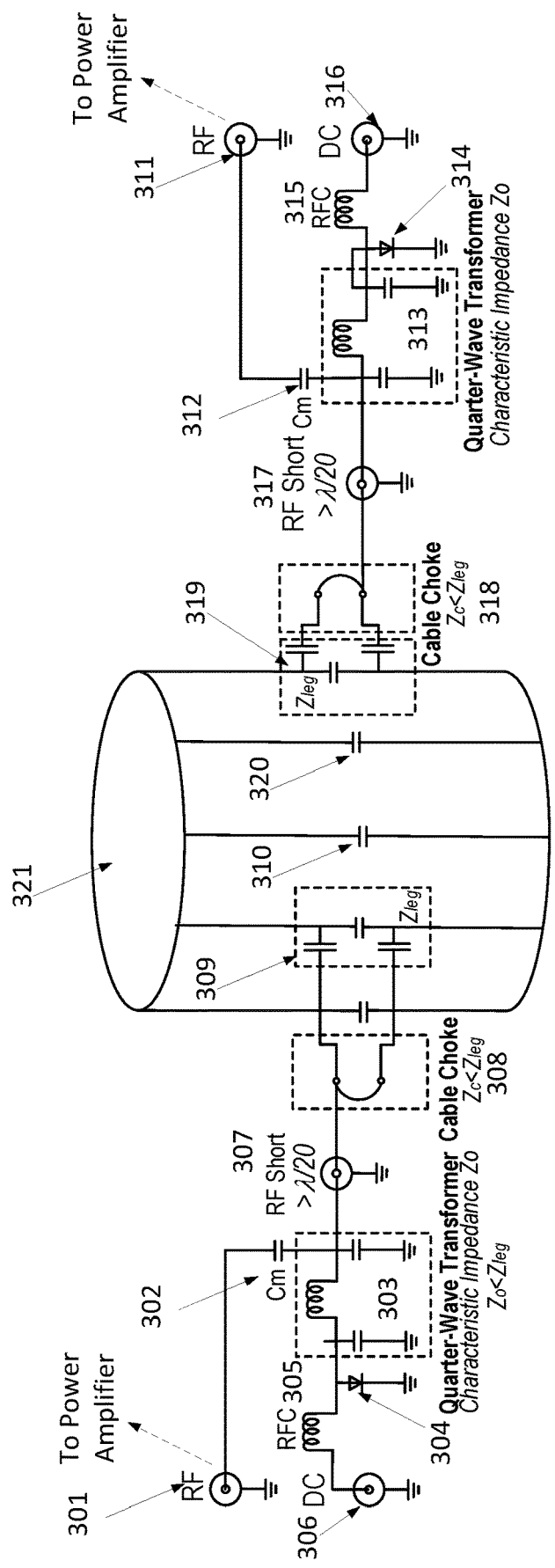
FIG. 3 illustrates an example of a radio frequency (RF) coil assembly incorporating a birdcage coil as illustrated in FIG. 2.

Referring to a circuit diagram 300 of FIG. 3, diode 304 is placed behind ¼-wave transformer 303 which is 'teed-off' from the RF power feed 301 that goes to the birdcage coil 321. During an "ON" state, the diode 304 is forward biased by a bias voltage applied from DC source 306 through RF choke 305. Once forward biased, the diode 305 transforms the ¼-wave transformer 303 (which has a characteristic impedance $Z_0$, $Z_0 < Z_{leg}$) into an open circuit. As an open circuit, RF power from RF source 301 (which is coupled to matching capacitor 302) goes directly to the coil 321 on leg 309 viacable chole 308 (which has a characteristic impedance $Z_c$, $Z_c < Z_{leg}$) and RF short 307 (which is shorter than $\lambda/20$, and $\lambda$ is the wavelength at Larmor frequency). Separately, diode 314 is likewise placed behind another ¼-wave transformer 313 which is 'teed-off' from the RF power feed 311 that goes to the birdcage coil 321. RF power feed 311 is coupled to matching capacitor 312. During this "ON" state, the diode 314 is forward biased by a bias voltage applied from DC source 316 through RF choke 315 so that diode 315 transforms the ¼-wave transformer 313 (which also has a characteristic impedance $Z_0$, $Z_0 < Z_{leg}$) into an open circuit, which, in turn, causes power from RF source 301 to go directly to the coil 321 on leg 319 via cable choke 318 (which also has a characteristic impedance $Z_c$, $Z_c < Z_{leg}$) and RF short 317 (which is shorter than $\lambda/20$, and $\lambda$ is the wavelength at Larmor frequency). Thus, birdcage coil 321 receives RF power on both feeds and operates as a resonant structure.

During an "Off" state, diode 304 is provided zero- or reverse-bias from DC source 306. As such, the ¼-wave transformer 303 presents a short circuit, which leads to a short circuit in parallel with both the feed matching circuit (including cable choke 308 (with a characteristic impedance Zc, Zc<Zleg) and RF short 307 (which is shorter than $\lambda/20$)) and birdcage leg 309. Separately, diode 314 is provided zero- or reverse-bias from DC source 316 to transform the ¼-wave transformer 303 into a short circuit, which leads to a short circuit in parallel with both the feed matching circuit (including cable chole 318 (with a characteristic impedance Zc, Zc<Zleg) and RF short 317 (which is shorter than $\lambda/20$)) and birdcage leg 319. As a result, the birdcage coil is detuned.

The described circuits can be integrated into hybrid combiners as well as scaled-up for other birdcages or volume resonators with more than two feeds. Hence, the described embodiments can perform electromagnetic switching for a volume resonator by shifting the resonant frequency sufficiently away from the Larmor frequency of interest. This detuning mechanism can be particularly used when operating multiple RF coils located inside the MRI scanner so that the RF coils are isolated from one another. In particular, the disclosed embodiments do not place fast switching diodes, such as PIN diodes, on the volume resonator, such as a birdcage coil. Instead, the embodiments seek to place the fast switching diodes away from the volume resonator. In some embodiments, the fast switching diodes are placed behind a quarter-wave transformer such that when these fast switching diodes are forward biased to present short-circuits, a much smaller amount of DC and RF current end up flowing through the fast switching diodes as would be produced during transmit when such fast switching diodes are placed before the quarter-wave transformer towards the volume resonator (or even on the volume resonator). Additionally, placing the fast switching diodes away from the volume resonator reduces the amount of distortion to field homogeneity (e.g., within volume 222 of birdcage coil 200) of the transmit field, thereby improving the overall efficiency of the RF coil.

Embodiments can include a coil assembly for imaging the head, the shoulder, the elbow, the hip, the knee, or the angle. Some embodiments include a RF coil, a quarter-wave transformer, and a fast switching diode placed away from the RF coil and behind the quarter-wave transformer. The RF coil can be a birdcage coil. Such embodiments may include an array of RF coils. In some embodiments, the RF coil is a quadrature coil. The RF coil itself may not contain a fast switching diode, such as a PIN diode. In these embodiments, the fast-switching diodes are capable of switching times in cadence with MRI pulse sequences. These fast switching diodes also enjoy long install life, and high-power handling (for example, up to 4 kV and 100 W continuous RF power).

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A coil assembly for performing magnetic resonance (MR) imaging of a subject immersed in a main magnet, comprising:
   a radio frequency (RF) coil shaped and sized to cover at least a portion of the subject immersed in the main magnet;
   a quarter-wave transformer coupled to the RF coil and serially connected to a capacitor with respect to a power feed from a power amplifier; and
   a diode placed behind the quarter-wave transformer and away from the RF coil, wherein:
   (i) when the diode is forward biased, the diode turns the quarter-wave transformer into an open circuit such that the power feed from the power amplifier provides sufficient electrical power through the capacitor for the RF coil to transmit an RF pulse into the portion of the subject; and
   (ii) when the diode is provided zero or reverse bias, the diode turns the quarter-wave transformer into a short circuit such that the RF coil is detuned from a Lamor frequency of nuclei from the portion of the subject immersed in the main magnet.

2. The coil assembly of claim 1, wherein the diode is a positive-intrinsic-negative (PIN) diode.

3. The coil assembly of claim 1, wherein the RF coil is a birdcage coil.

4. The coil assembly of claim 3, wherein the RF coil is a quadrature coil.

5. The coil assembly of claim 1, wherein the RF coil is without a diode.

6. The coil assembly of claim 1, wherein the RF coil is integrated into a transmit/receive coil for transmitting the RF pulse into the portion of the subject and for receiving resonant RF signals emitted from the portion of the subject in response to the RF pulse being transmitted.

7. The coil assembly of claim 1, wherein when the diode is forward biased, the RF coil is resonant.

8. The coil assembly of claim 1, wherein when the diode is provided zero or reverse bias, the short circuit parallels a matching feed to the RF coil.

9. The coil assembly of claim 1, wherein the diode is configured to be switchable between an "On" state and an "Off" state at a speed suitable for performing MR imaging.

10. The coil assembly of claim 1, wherein the diode is configured to handle up to 4 kV peak voltage and 100 Watts of continuous RF power.

11. A magnetic resonance imaging (MRI) system, comprising:
    a housing having a bore in which a subject to be imaged is placed;
    a main magnet accommodated by said housing and configured to generate a polarizing magnetic field within the bore;
    a coil assembly configured to generate and apply radio frequency (RF) pulses in sequence to scan the subject placed in the bore, the coil assembly comprising:
        a radio frequency (RF) coil shaped and sized to cover at least a portion of the subject immersed in the polarizing magnetic field;
        a quarter-wave transformer coupled to the RF coil and serially connected to a capacitor with respect to a power feed from a power amplifier; and
        a diode placed behind the quarter-wave transformer and away from the RF coil, wherein:
        (i) when the diode is forward biased, the diode turns the quarter-wave transformer into an open circuit such that the power feed from the power amplifier provides sufficient electrical power through the capacitor for the RF coil to transmit an RF pulse into the portion of the subject; and
        (ii) when the diode is provided zero or reverse bias, the diode turns the quarter-wave transformer into a short circuit such that the RF coil is detuned from a Lamor frequency of nuclei from the portion of the subject immersed in the main magnet;
    gradient coils configured to provide perturbations to the polarizing magnet field that encode MRI signals acquired in response to the applied RF pulses; and
    a control unit coupled to the main magnet, the coil assembly and the gradient coils, the control unit configured to synchronize the coil assembly and the gradient coils such that the MM signals are acquired and then reconstructed to form an image of at least the portion of the subject.

12. The MM system of claim 11, wherein the diode is a positive-intrinsic-negative (PIN) diode.

13. The MM system of claim 12, wherein the RF coil is a birdcage coil.

14. The MM system of claim 13, wherein the RF coil is a quadrature coil.

15. The MRI system of claim 11, wherein the RF coil is integrated into a transmit/receive coil for transmitting the RF pulse into the portion of the subject and for receiving resonant RF signals emitted from the portion of the subject in response to the RF pulse being transmitted.

16. The MM system of claim 11, wherein when the diode is forward biased, the RF coil is resonant.

17. The MM system of claim 11, wherein when the diode is provided zero or reverse bias, the short circuit parallels a matching feed to the RF coil.

18. The MM system of claim 11, wherein the diode is configured to be switchable between an "On" state and an "Off" state at a speed suitable for performing MR imaging.

19. The MM system of claim 11, wherein the diode is configured to handle up to 4 kV peak voltage and 100 Watts of continuous RF power.

20. A method for operating a coil assembly on a magnetic resonance imaging (MRI) system, the method comprising:
    placing a subject in a main magnet of the Mill system such that a radio frequency (RF) coil is located over at least a portion of the subject;
    driving the RF coil coupled to a quarter-wave transformer and a diode such that
    (i) when the diode is forward biased, the diode turns the quarter-wave transformer into an open circuit such that a power feed from a power amplifier provides sufficient electrical power through a capacitor for the RF coil to transmit an RF pulse into the portion of the subject; and
    (ii) when the diode is provided zero or reverse bias, the diode turns the quarter-wave transformer into a short circuit such that the RF coil is detuned from a Lamor frequency of nuclei from the portion of the subject immersed in the main magnet, and
    wherein the diode is placed behind the quarter-wave transformer and away from the RF coil, and wherein the quarter-wave transformer is serially connected to the capacitor with respect to the power feed from the power amplifier.

* * * * *

UNITED STATES PATENT AND TRADEMARK OFFICE
CERTIFICATE OF CORRECTION

PATENT NO. : 11,073,581 B2
APPLICATION NO. : 16/419098
DATED : July 27, 2021
INVENTOR(S) : Ian Robert Oliphant Connell Page 1 of 1

It is certified that error appears in the above-identified patent and that said Letters Patent is hereby corrected as shown below:

On the Title Page

Item (57), Line 13, delete "Lamor" and insert --Larmor--.

In the Claims

In Column 7, Claim 1, Line 1 and Claim 11, Line 54; and at Column 8, Claim 20, Line 48, delete "Lamor" and insert --Larmor--.

In Column 8, Claim 11, Line 7; Claim 12, Line 10; Claim 13, Line 12; Claim 14, Line 15; Claim 16, Line 22, Claim 17, Line 24; Claim 18, Line 27; and Claim 19, Line 30, delete "MM" and insert --MRI--.

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*